United States Patent

Shah et al.

Patent Number: 5,484,766
Date of Patent: Jan. 16, 1996

[54] PREPARATION OF BI-PB-SR-CA-CU-O (2223) SUPERCONDUCTORS

[75] Inventors: Dinesh O. Shah, Gainesville, Fla.; Promod Kumar, Flossmoor, Ill.; Vinod K. Pillai, Gainesville, Fla.

[73] Assignee: Electric Power Research Institute, Inc., Palo Alto, Calif.

[21] Appl. No.: 195,584

[22] Filed: Feb. 14, 1994

[51] Int. Cl.$^6$ ............ C01F 11/00; C01G 29/00; C01G 21/00; C01G 3/00
[52] U.S. Cl. ............ 505/441; 505/782; 505/784; 423/593
[58] Field of Search .............. 423/593; 505/782, 505/784, 441

[56] References Cited

U.S. PATENT DOCUMENTS

| | | | |
|---|---|---|---|
| 4,588,575 | 5/1986 | David | 423/593 |
| 4,959,347 | 9/1990 | Kobayashi et al. | 505/1 |
| 4,999,323 | 3/1991 | Sang et al. | 423/594 |
| 5,004,720 | 4/1991 | Kobayashi et al. | 505/1 |
| 5,035,876 | 7/1991 | Catellano | 423/608 |
| 5,066,636 | 11/1991 | Liu et al. | 505/1 |
| 5,071,829 | 12/1991 | Chiang et al. | 505/1 |
| 5,077,265 | 12/1991 | Ritter | 505/1 |
| 5,108,985 | 4/1992 | Iino et al. | 505/1 |
| 5,147,848 | 9/1992 | Chang et al. | 505/1 |
| 5,162,300 | 11/1992 | Bock et al. | 505/1 |

OTHER PUBLICATIONS

Ayyub, et al. "Formation of . . . Microemulsion–Mediated Process", Physica C 168, 1990, no month, pp. 571–579.
Bernhard, et al, "Formation of . . . Oxalates", J. of Solid State Chemistry, 86, 1990, no month, pp. 293–299.
Kumar P. et al, "Preparation of Bi–Pb–Sr–Ca–Cu–O oxide superconductors by coprecipitation of nanosize oxalate precursor powders in the aqueous core of water–in–oil microemulsions", Appl. Phys. Lett., vol. 62, No. 7, pp. 765–767, Feb. 15, 1993.

*Primary Examiner*—Steven Bos
*Attorney, Agent, or Firm*—Fish & Richardson

[57] ABSTRACT

A method for synthesizing ultrahomogeneous nanoparticles of precursor powder by coprecipitation in a water and oil microemulsion is disclosed. The powder is compressed and sintered to prepare an essentially pure 2223 superconductor.

9 Claims, 1 Drawing Sheet

PREPARATION OF BI-PB-SR-CA-CU-O (2223) SUPERCONDUCTORS

This invention was made with government support under Grant No. CTS-9215384 awarded by the National Science Foundation. The government has certain rights in the invention.

The present invention is directed to a method for making Bi-Pb-Sr-Ca-Cu-O superconductors and, in particular, to a method for making homogenous nanoparticles of precursor powder for use in preparation of such superconductors.

FIELD OF THE INVENTION

Since the discovery of superconductivity in the Bi-Pb-Sr-Ca-Cu-O system, reported by Maeda, *Jpn. J. App. Phys.*, 27, L209 (1988), it has proved difficult to prepare the monophasic (2223) high $T_c$ (critical temperature) superconductor which exhibits the Meissner effect in the 105°–115° K. temperature range. Heretofore, there have been generally four methods used to promote formation of the high $T_c$ phase: by doping with lead, by careful control of sintering temperature in prolonged (greater than 100 hours) heat treatment, sintering under reduced oxygen pressure, and modification of the starting nominal composition (Sasakura, *Jpn. J. App. Phys.* 28, L 1163 (1989); and Tanaka, et al., *Appl. Phys. Lett.* 55, 1252 (1989)). The synthetic approaches utilized to achieve an acceptable level of homogeneity of the metals involve wet chemical techniques such as coprecipitation, freeze drying and a process involving amorphous citrates of the metals. Among the methods of coprecipitation, oxalate coprecipitation has been frequently used because the oxalates are readily decomposed under heat treatment. However, the methods heretofore has been unsatisfactory to consistently obtain the monophasic (2223) high $T_c$ superconductor state due, it is believed, in part, to the inability to consistently obtain the requisite microstructure of the particles in the sample. The properties of high temperature superconductors are critically dependent upon the microstructure. The control of size, size distribution, and morphology of the precursor powder and the subsequent heat treatment conditions are critical to obtaining the desired microstructure. While wet chemicals synthesis is advantageous over solid state reaction techniques (i.e., sputtering) in obtaining homogeneity and controlling particle size during coprecipitation, obtaining smaller particles is still desirable.

It is thus an object of the present invention to provide a method for coprecipitating the metals of Bi, Pb, Sr, Ca, Cu in a nanosize domain (typically in a range of 5–25 nm) to obtain improved homogeneity and to provide ultrafine precursor powder.

It is yet another object of the present invention to provide ultrafine precursor powder to Bi-Pb-Sr-Ca-Cu-O superconductors which can be advantageously densified and sintered to form a 2223 oxide superconductor of almost theoretical density with a high Meissner effect compared to superconductors made by bulk coprecipitation methods.

These and other objects will be apparent from the following description and from the practice of the invention.

SUMMARY OF THE INVENTION

The present invention provides a method of preparing metal oxide superconductor compositions comprising the steps of forming a uniform mixture of metal elements as cations in a solvent wherein the elements are in stoichiometric proportion suitable for producing the superconductor Bi-Pb-Sr-Ca-Cu-O system; forming a first microemulsion comprising the metal cations, a surfactant, a hydrocarbon liquid and an aqueous liquid; mixing the first microemulsion with a second microemulsion wherein the second microemulsion comprises a precipitating agent for the metal cations, the surfactant, hydrocarbon liquid and an aqueous liquid; thereby forming a nanoparticle precipitate, separating the precipitate from the liquid phase, drying the precipitate to form a powder, calcining and compressing the powder; then sintering the compressed powder to form the superconductor composition.

DETAILED DESCRIPTION OF THE PREFERRED EMBODIMENTS

Figure 1:
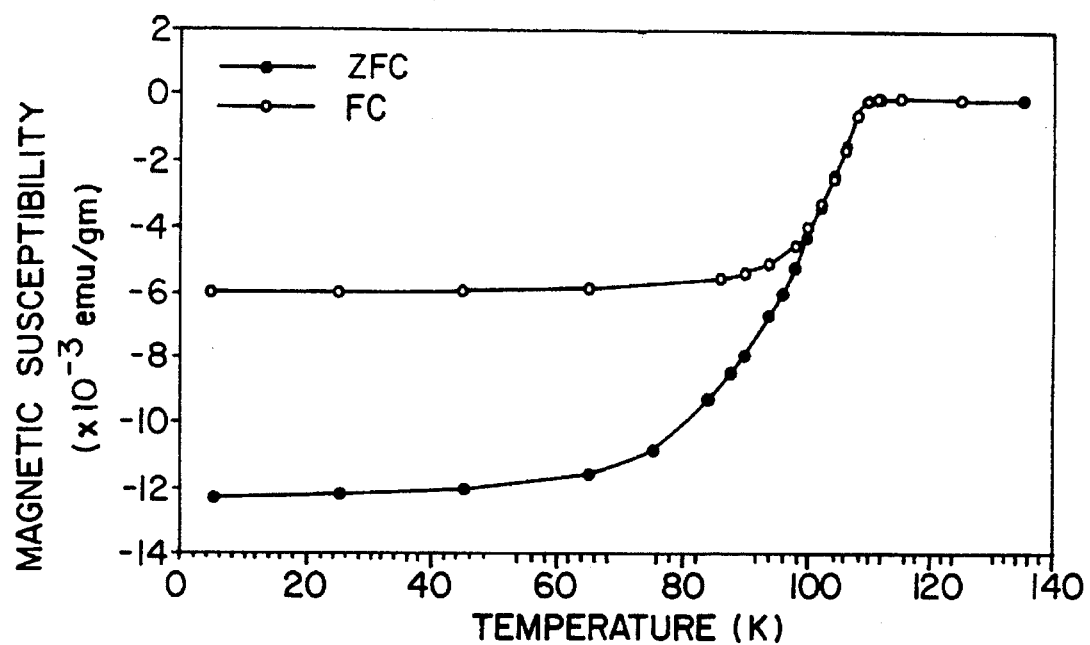
FIG. 1 is a graph showing the dc-magnetic suceptibility of a Bi-Pb-Sr-Ca-Cu-O superconductor made according to the present invention as a function of temperature of the sample sintered at 840° C.

According to the present invention, metal salts or oxides of Bi, Pb, Sr, Ca, and Cu are uniformly dissolved, dispersed or suspended in a solvent whereby a homogenous mixture is readily obtained. The oxides, acetates and carbonates are the preferred derivatives since they may be typically dissolved in acids, such as acetic acid and decompose by heating. The preferred derivatives are $Bi_2O_3$, $Pb(Ac)_2$, $SrCO_3$, $CaCO_3$ and $Cu(Ac)_2$. Typically these compounds are immediately dissolved in acetic acid/water, heated to dryness and then redissolved in acid solution, such as 50/50 acetic/water. The metal salts or oxides utilized should be of high purity to avoid contamination of the superconducting oxide structure which could adversely affect the superconducting properties.

A microemulsion containing all of the metal cations in the required stoichiometric ratio is then formed by forming a water:oil microemulsion of the cations in a nonionic surfactant, preferably a surfactant with an HLB of greater than 7 and less than 11, an aqueous liquid and an a hydrocarbon liquid. The hydrocarbon liquid may be any water immiscible hydrocarbon liquid, typically having five or more carbon atoms such as hexane, heptane, and octane, iso-octane, etc. as well as cyclic hydrocarbons such as cyclopentane, cyclohexane, etc. The preferred hydrocarbon liquid is cyclohexane. The aqueous phase is provided by an aqueous solution containing the metal ions. A typical and preferred surfactant is nonylphenoxypoly(ethyleneoxy) ethanol (commercially available as IGEPAL CO-430), however, other water:oil sUrfactants may be utilized. To form a typical microemulsion, the preferred surfactant (15 grams) may be mixed with 50 ml of cyclohexane and 10 ml of the aqueous solution containing the metal salts. The mixture instantaneously forms a microemulsion upon stirring whereby the continuous phase is cyclohexane and the metal ions are entrapped in aqueous cores within the microemulsion.

A second microemulsion is prepared containing the precipitating agent, i.e. an agent which when contacted with the metal ions will form a precipitate with the metal ions. While various compounds are known to precipitate metal ions, a preferred compound is oxalic acid, which forms the oxalates of metal ions. The second microemulsion will contain the same surfactant utilized in the first microemulsion and same hydrocarbon continuous phase. Hence, preferably, the second microemulsion is made with an aqueous solution of oxalic acid, cyclohexane and the surfactant. A typical microemulsion would comprise 15 grams of the surfactant, 50 mls of cyclohexane and 10 mls of the aqueous solution of oxalic acid wherein the total amount of oxalic acid is sufficient to form at least a stoichiometric amount for precipitating the amount of metal ions utilized. The preferred surfactant:aqueous phase:hydrocarbon molar ratios are typically about (0.23–0.24):(0.14–0.16):(0.61–0.62) for both microemulsions.

It is believed that the oxalic acid is entrapped within the aqueous cores of the second microemulsion. Typically, oxalic acid is present in slight excess, about 10 percent excess of the required stoichiometric amount. Oxalic acid solutions comprise preferably a 50/50 (volume/volume) acetic acid/water mixture, to correspond to the acetic acid/water mixture utilized to dissolve the metal ions.

By intimately mixing the two microemulsions it is believed that the reacting species, the metal ions and the oxalic acid, come into contact when the aqueous-microparticles of the two emulsions coalesce wherein the oxalic acid and metal ions contact within the small aqueous core of coalesced microparticles. Since both of the microemulsions have the same surfactant, hydrocarbon, and aqueous phase, the resultant microemulsion is not destabilized when mixed. The steric barrier provided by the surfactant monolayer is believed to restrict the growth of precipitated oxalate particles and to hinder intergrain coagulation. Moreover serial precipitation of cations, which may occur in conventional wet chemical bulk co-precipitation methods, is avoided. It is believed that the upper limit of chemical inhomogeneity is fixed by the dimension of the nanosize domain of the microparticles in the emulsion, usually about 5–25 nm.

The metal oxalate precipitate may then be processed to form a superconductor by separating the precipitate from the liquid phase, and drying to form a powder. Then the powder is calcined, compressed and sintered to form the superconducting composition.

There is no particular restriction to the calcining and sintering conditions such as temperatures and the atmosphere. Calcining and sintering are conducted usually at a temperature of from about 800° to 1000° C. for at least two hours. Preferably the calcining will be at a temperature of about 800° to 1000° C. for a period of about 2 to 24 hours. The compressed powder is preferably sintered at a temperature of about 850° to 1000° C., for at least two hours.

There is no particular restriction to the pressure for the compression of the powders into a form. Usually the pressure is at least about 120 mPA. The atmosphere for sintering may be oxygen or air.

There is no particular restriction to the cooling conditions after the sintering. Typically the sintered products may be naturally cooled in air or in an oxygen stream over a period of several hours.

The present invention is described in further detail by the following example. However, it is to be understood that the present invention is by no means restricted to a specific example.

EXAMPLE

Highly pure (greater than 99.9%) bismuth oxide ($Bi_2O_3$), lead diacetate, strontium carbonate ($SrCO_3$), calcium carbonate and cupric acetate were dissolved in 25:75 (V/V) acetic acid/water in the molar ratio of Bi:Pb:Sr:Ca:Cu of 1.84:0.34:1.91:2.03:3.06 using 0.0368M of $Bi^{3+}$. This solution was heated to dryness and the residue was redissolved in 50/50 acetic acid/water to obtain a clear blue solution. A microemulsion was formed using 15 grams of IGEPAL CO-430 surfactant (nonylphenoxypoly (ethyleneoxy) ethanol), 50 ml cyclohexane and 10 ml of the metal ion-containing solution.

Oxalic acid in ten percent excess of the required stoichiometric amount was dissolved in 50:50 (V/V) acetic acid/water and the microemulsion of this solution was formed in the proportions of 15 gram IGEPAL CO-430 surfactant (nonylphenoxypoly (ethyleneoxy) ethanol), 15 ml cyclohexane and 10 ml of the oxalic acid solution. The microemulsion containing all the metal cations in the required stoichiometric ratio was mixed with a second microemulsion containing oxalic acid as the aqueous phase. The resultant precipitate was separated in a superspeed centrifuge at 5,000 rpm for 10 minutes. This precipitate was washed repeatedly with a 1:1 methanol:chloroform mixture to remove all of the surfactant. A small drop of this suspension was placed on the transmission electron microscopy (TEM) grid for particle size analysis. A JEOL-200CX was used for TEM studies. The precipitate was dried at 100° C. in air the TEM micrograph of these particles indicated that the particles were fairly monodispersed with a size range of 2–6 nm. A few larger loose aggregates were also observed due to aggregation occurring during the washing step. Thermogravimetric measurements were performed on the coprecipitated oxalate precursor powder in air atmosphere by heating the powder at a heating rate of 10° C./min. in a DuPont (TGA/DTA) 900 Series instrument. There was a dramatic loss around 300° C. caused by the conversion of copper and bismuth oxalates to CuO and $Bi_2O_3$. A gradual weight loss occurred above 500° C. due to the loss of carbon dioxide from calcium carbonate and strontium carbonate. Two exothermic peaks in the DTA thermogram between 200° and 400° C. are in agreement with a sharp weight loss in the TGA curve, indicative of the loss of organic moieties.

The dehydrated precursor oxalate powder was calcined at 800° C. for 12 hours. The presence of all the metal species in virtually the same cationic ratio as were initially used was confirmed by dispersive X-ray analysis. The elemental composition analysis at several spots was uniform, which indicated a highly homogeneous material. The calcined powder was pressed into pellets of 6 mm diameter under a static pressure of 120 MPa and sintered for 96 hours (unoptimized) at 850° C. in air in a tube furnace.

Figure 2:
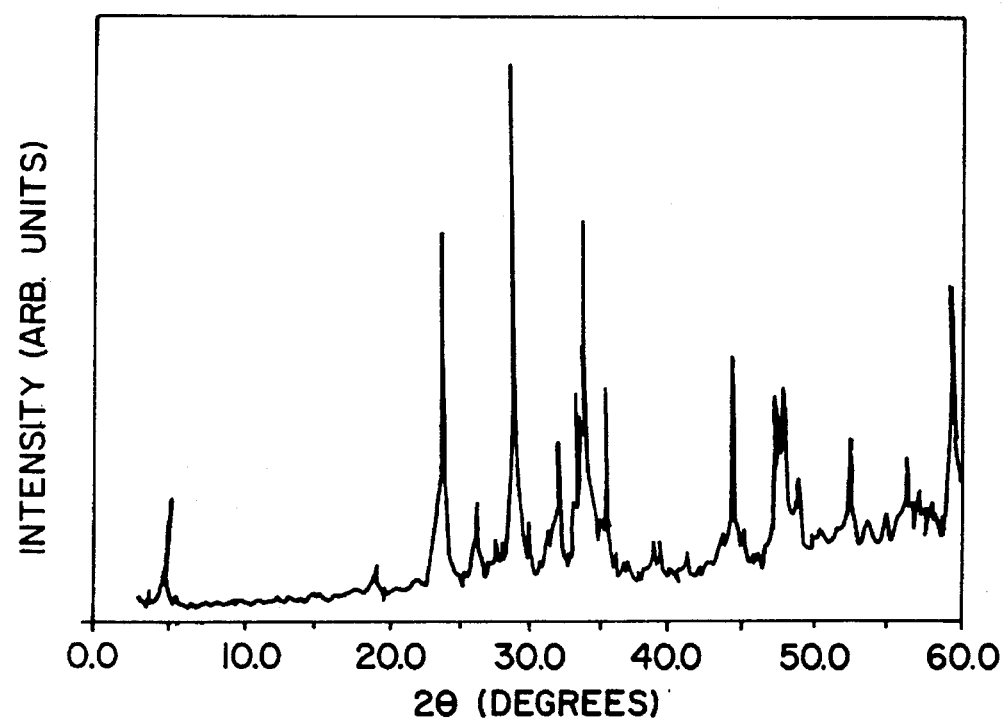
FIG. 2 is a plot of powder X-ray diffraction pattern of a sintered sample of superconductor made according to the present invention.

The magnetization data were recorded with commercial superconducting quantum interference device magnetometer (quantum) design. The dc-magnetic susceptibility measurement as a function of temperature is shown in FIG. 1. An abrupt change in the magnetization curve is observed at 112° K. marking the transition to the superconducting state. No step around 80K was observed in the magnetization curve, which is due to the presence of the 2212 phase. The zero field cooled signal (diamagnetic shielding) corresponds to 93% of the Meissner shielding expected from an ideal sample (minus $\frac{1}{4}\pi$). The X-ray powder diffraction spectra were obtained on a Philips X-ray diffractometer using CuK$\alpha$ radiation at 40 KV, 20 mA. FIG. 2 shows the X-ray diffraction pattern of the sample after 96 hours of sintering at 840° C. The series characteristic diffraction peaks of 110K phase, 002,0010, at $2\Theta=4.8°$ and 23.9° are seen in the diffractogram. The 80 and 200K phases, whose characteristic peaks are at $2\Theta=5.7°$ and 7.2°, respectively, are not observed, but weak additional peaks are observed at $2\Theta=30°-31°$ C. These results unambiguously indicate that almost a pure 2223 phase oxide superconductor has been achieved. Large lameliar-like grains were formed and highly dense layered materials result after sintering. The density of the sintered sample, as determined by helium pycnometry is 97% of theoretical value.

What is claimed is:

1. A method of preparing a metal oxide Bi-Pb-Sc-Ca-Cu superconductor composition comprising the steps of:

a) forming a uniform mixture of metal elements Bi, Pb, Sr, Ca and Cu as cations in a solvent, said metal elements being in a stoichiometric proportion suitable for producing said metal oxide superconductor composition;

b) forming a first microemulsion having an aqueous discontinuous phase and comprising said metal cations, a surfactant, a water-immiscible hydrocarbon liquid and aqueous liquid;

c) mixing said first microemulsion with a second microemulsion having a discontinuous aqueous phase, said second microemulsion comprising a precipitating agent, said surfactant, said hydrocarbon liquid and said aqueous liquid to form a nanosized particulate precipitate;

d) separating said precipitate from the mixture of step (c) and drying said precipitate to form a powder;

e) calcining and compressing said powder;

f) sintering said compressed powder to form said superconductor composition.

2. A method according to claim 1 wherein said aqueous discontinuous phase in said first microemulsion and in said second microemulsion comprise aqueous cores in a range of 5–25 nm in diameter.

3. A method according to claim 1 wherein said metal cations comprise $Bi^{+3}$, $Pb^{+2}$, $Sr^{+2}$, $Ca^{+2}$, and $Cu^{+2}$.

4. A method according to claim 1 wherein said precipitating agent comprises oxalic acid.

5. A method according to claim 3 wherein said metal oxide superconductor composition formed therefrom comprises an essentially pure 2223 superconductor phase.

6. A method of preparing a precursor of a metal oxide Bi-Pb-Sr-Ca-Cu superconductor composition comprising the steps of:

a) forming a uniform mixture of metal elements Bi, Pb, Sr, Ca and Cu as cations in a solvent, said metal elements being in a stoichiometric proportion suitable for producing said metal oxide superconductor composition;

b) forming a first microemulsion having an aqueous discontinuous phase and comprising said metal cations, a surfactant, a water-immiscible hydrocarbon liquid and aqueous liquid;

c) mixing said first microemulsion with a second microemulsion having an aqueous discontinuous phase, said second microemulsion comprising a precipitating agent, said surfactant, said hydrocarbon liquid and said aqueous liquid to form a nanosized particulate precipitate;

d) separating said precipitate from the mixture of step (c) and drying said precipitate to form a powder.

7. A method according to claim 6 wherein said aqueous discontinuous phase in said first microemulsion and in said second microemulsion comprise aqueous cores in a range of 5–25 nm in diameter.

8. A method according to claim 6 wherein said metal cations comprise $Bi^{+3}$, $Pb^{+2}$, $Sr^{+2}$, $Ca^{+2}$, and $Cu^{+2}$.

9. A method according to claim 6 wherein said precipitating agent comprises oxalic acid.

* * * * *

UNITED STATES PATENT AND TRADEMARK OFFICE
CERTIFICATE OF CORRECTION

PATENT NO. : 5,484,766
DATED : January 16, 1996
INVENTOR(S) : Dinesh O. Shah, Promod Kumar and Vinod K. Pillai It is certified that error appears in the above-indentified patent and that said Letters Patent is hereby corrected as shown below:

Title Page: Attorney, Agent, or Firm—replace "Fish & Richardson" with --Fish & Richardson P.C.--

Column 1, line 34: replace "methods" with --method--

Column 2, line 43: delete the second occurrence of "an"

Column 3, line 21: delete the "-" after the word "aqueous"

Column 4, line 22: replace "air the" with --air. The--

Column 5, line 1: replace "liar" with --llar--

Signed and Sealed this

Twenty-third Day of July, 1996

*Attest:*

BRUCE LEHMAN

*Attesting Officer*     *Commissioner of Patents and Trademarks*

UNITED STATES PATENT AND TRADEMARK OFFICE
CERTIFICATE OF CORRECTION

PATENT NO.   : 5,484,766

DATED        : January 16, 1996

INVENTOR(S)  : Dinesh O. Shah, Promod Kumar and Vinod K. Pillai

It is certified that error appears in the above-identified patent and that said Letters Patent is hereby corrected as shown below:

Item [73];

Title Page: Assignee: replace "Electric Power Research Institute, Inc., Palo Alto, Calif." with --University of Florida, Gainesville, Florida--

Signed and Sealed this

First Day of October, 1996

Attest:

BRUCE LEHMAN

Attesting Officer       Commissioner of Patents and Trademarks